United States Patent
Kliss et al.

(10) Patent No.: US 11,482,988 B1
(45) Date of Patent: Oct. 25, 2022

(54) SYSTEM AND METHOD FOR TUNING TRANSISTOR-BASED NON-FOSTER NEGATIVE IMPEDANCE CIRCUITS FOR LOW-FREQUENCY ANTENNAS

(71) Applicant: SRC, Inc., North Syracuse, NY (US)

(72) Inventors: Gregory J. Kliss, Syracuse, NY (US); Harvey K. Schuman, Fayetteville, NY (US); Dojana Y. Salama, Eaton, NY (US)

(73) Assignee: SRC, Inc., North Syracuse, NY (US)

( * ) Notice: Subject to any disclaimer, the term of this patent is extended or adjusted under 35 U.S.C. 154(b) by 2 days.

(21) Appl. No.: 17/349,201

(22) Filed: Jun. 16, 2021

(51) Int. Cl.

| | |
|---|---|
| *H01Q 9/16* | (2006.01) |
| *H03H 11/02* | (2006.01) |
| *H01Q 7/00* | (2006.01) |
| *H01Q 9/18* | (2006.01) |
| *H01Q 13/10* | (2006.01) |
| *H01Q 11/06* | (2006.01) |
| *H01Q 9/24* | (2006.01) |

(52) U.S. Cl.
CPC .............. *H03H 11/02* (2013.01); *H01Q 9/16* (2013.01); *H01Q 7/005* (2013.01); *H01Q 9/18* (2013.01); *H01Q 9/24* (2013.01); *H01Q 11/06* (2013.01); *H01Q 13/103* (2013.01)

(58) Field of Classification Search
CPC .......... H03H 11/02; H01Q 9/16; H01Q 11/06; H01Q 9/18; H01Q 7/005; H01Q 13/103; H01Q 9/24
See application file for complete search history.

(56) References Cited

U.S. PATENT DOCUMENTS

2013/0009724 A1* 1/2013 Xu .................... H03H 11/44
333/32

* cited by examiner

*Primary Examiner* — Joseph J Lauture
(74) *Attorney, Agent, or Firm* — George McGuire

(57) ABSTRACT

A system and method for tuning a transistor-based circuit. The system includes a negative impedance converter circuit having a capacitor, a first transistor, and a second transistor. As a current travels through the capacitor, the first transistor and the second transistor each sample voltage at the capacitor and invert the voltage at an input of the negative impedance converter circuit. The negative impedance converter circuit also has a third transistor in series with the capacitor. The third transistor has a base voltage. Changing the base voltage of the third transistor changes the voltage sampled by the first transistor and the second transistor.

20 Claims, 5 Drawing Sheets

SYSTEM AND METHOD FOR TUNING TRANSISTOR-BASED NON-FOSTER NEGATIVE IMPEDANCE CIRCUITS FOR LOW-FREQUENCY ANTENNAS

GOVERNMENT FUNDING

N/A

BACKGROUND OF THE INVENTION

1. Field of the Invention

The present invention relates to a system and method for tuning transistor-based circuits and, more particularly, to a system and method for tuning transistor-based non-Foster negative impedance circuits for low-frequency antennas.

2. Background of the Invention

There is a consumer interest in applications for systems that operate in the "low" frequency ranges as low as 20 MHz. However, operation at low frequencies has been a longstanding problem. Antenna size is inversely proportional to frequency, and for these "low" frequency applications, resonant antennas are too large for practical use. For example, many of these systems are vehicle-mounted, which introduces a size limitation. For reference, a ½ wave dipole, which is resonant at 20 MHz, would be 7.5 meters long (approximately 25 feet). Furthermore, for direction finding applications, typically 3-4 antennas are required, with an ideal spacing of ½ lambda. This translates to four antennas that are 25 feet long with a 25-foot diameter, which is too large to fit on a vehicle.

The challenge to designing an electrically small antenna (ESA) is large impedance mismatch. The popular solution to this problem has been the utilization of traditional passive matching networks, such as those found on an AM/FM radio, etc. Unfortunately, passive matching networks are inherently narrow band. While they work great for a small range of frequencies, they do not provide any benefit across a wide bandwidth.

Another approach is to deploy a non-Foster matching circuit, which exhibits as a negative reactance slope with frequency resulting in a much wider bandwidth match. Specifically, traditional non-Foster based circuits invert a load impedance to create a negative impedance slope and adjustments are made by modifying the load impedance. In an example, a capacitive load of 10 pF is matched at 100 MHz. Under conventional matching techniques, one could use a 253 nH inductor in series to bring the reactance to zero. As shown in FIG. 1A, the reactance is only minimized for frequencies around 100 MHz, and becomes quickly mismatched as the bandwidth increases. FIG. 1B shows use of a negative capacitance element to match the reactance. In this case, with a load of 10 pF, a shunt −10 pF capacitor circuit is produced, and the resulting reactance is plotted and shown to be zero for all frequencies, assuming the negative capacitance circuit has this ideal response. Previous work has successfully shown antenna matching improvements using non-Foster impedance networks. Other work has been done to add tunability to non-Foster circuits by replacing physical components or using a varactor (i.e., variable capacitor). However, tuning through such methods does not allow for on-the-fly (i.e., immediate) tuning.

Therefore, there is a need for a new method for creating a tunable non-Foster circuit that does not rely on modifying the load, and using that tunable non-Foster circuit with a resistively loaded dipole for direction finding applications.

Background of the Invention Disclaimer Section Disclaimer: To the extent that specific patents/publications/products are discussed above in this Description of the Related Art Section or elsewhere in this disclosure, these discussions should not be taken as an admission that the discussed patents/publications/products are prior art for patent law purposes. For example, some or all of the discussed patents/publications/products may not be sufficiently early in time, may not reflect subject matter developed early enough in time and/or may not be sufficiently enabling so as to amount to prior art for patent law purposes. To the extent that specific patents/publications/products are discussed above in this Description of the Related Art Section and/or throughout the application, the descriptions/disclosures of which are all hereby incorporated by reference into this document in their respective entirety(ies).

BRIEF SUMMARY OF THE INVENTION

The present disclosure focuses on a transistor-based negative impedance converter (NIC) and introduces an alternate way to create a tunable NIC circuit. Embodiments of the present invention are directed to a Linville transistor-based negative impedance converter (NIC) modified to make it tunable. The present disclosure also describes incorporating the tunable NIC with a resistively loaded dipole antenna for direction finding applications.

An embodiment of the system for tuning a transistor-based circuit includes a negative impedance converter circuit having a capacitor, a first transistor, and a second transistor. As a current travels through the capacitor, the first transistor and the second transistor each sample voltage at the capacitor and invert the voltage at an input of the negative impedance converter circuit. The negative impedance converter circuit also has a third transistor in series with the capacitor. The third transistor has a base voltage. Changing the base voltage of the third transistor changes the voltage sampled by the first transistor and the second transistor.

According to another aspect, the method for tuning a transistor-based circuit includes the steps of: (i) providing a negative impedance converter circuit having a capacitor, a first transistor, and a second transistor, and a third transistor in series with the capacitor; (ii) passing a current through capacitor; (iii) sampling, via the first transistor and the second transistor, a voltage at the capacitor; (iv) inverting, via the first transistor and the second transistor, the voltage at an input of the negative impedance converter circuit; and (v) changing a base voltage of the third transistor, which changes the voltage sampled by the first transistor and the second transistor.

According to yet another aspect, present invention is a system for tuning a transistor-based circuit for a wide band, omni-directional receive antenna. The system includes a resistively loaded dipole antenna having a negative impedance converter circuit with a capacitor, a first transistor, and a second transistor. As a current travels through the capacitor, the first transistor and the second transistor each sample voltage at the capacitor and invert the voltage at an input of the negative impedance converter circuit. The negative impedance converter circuit also has a third transistor in series with the capacitor. The third transistor has a base voltage. Changing the base voltage of the third transistor changes the voltage sampled by the first transistor and the second transistor.

These and other aspects of the invention will be apparent from and elucidated with reference to the embodiment(s) described hereinafter.

BRIEF DESCRIPTION OF THE SEVERAL VIEWS OF THE DRAWING(S)

The present invention will be more fully understood and appreciated by reading the following Detailed Description in conjunction with the accompanying drawings. The accompanying drawings illustrate only typical embodiments of the disclosed subject matter and are therefore not to be considered limiting of its scope, for the disclosed subject matter may admit to other equally effective embodiments. Reference is now made briefly to the accompanying drawings, in which.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known structures are omitted so as not to unnecessarily obscure the invention in detail. It should be understood, however, that the detailed description and the specific non-limiting examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Figure 1A:
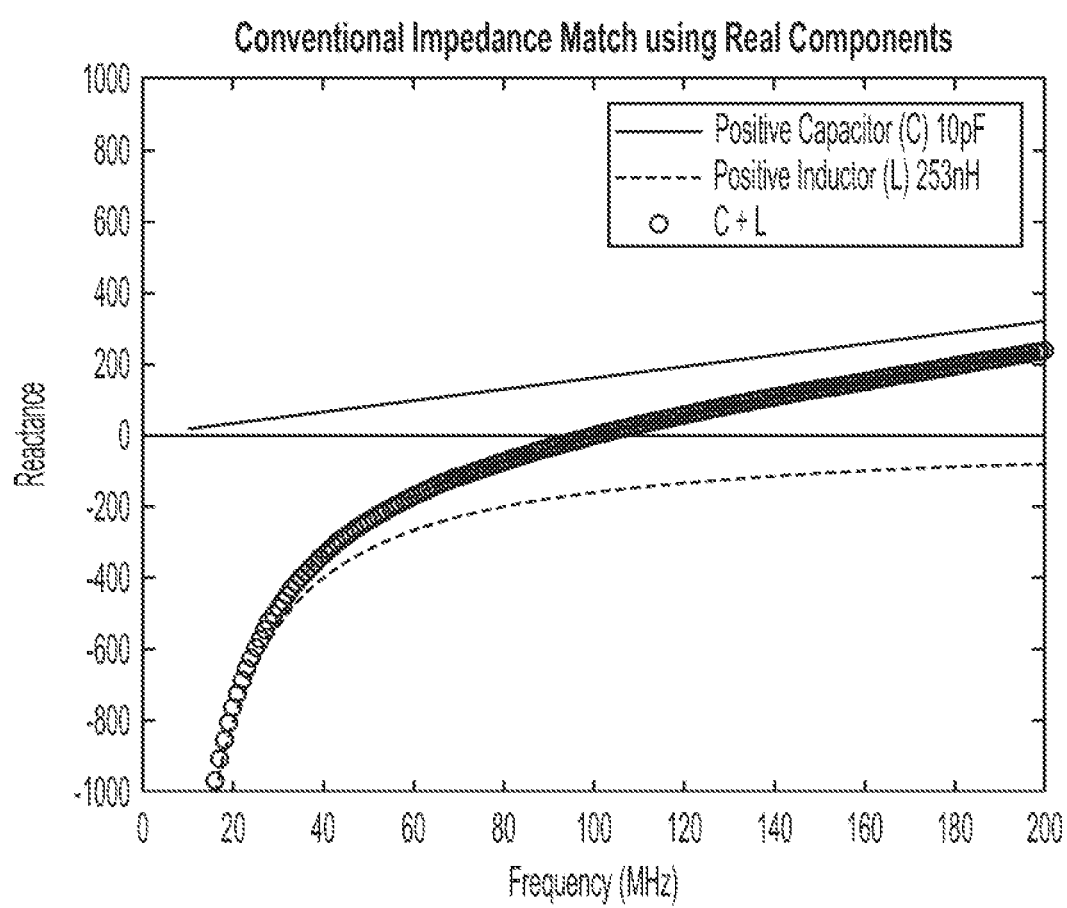
FIG. 1A is a graph showing a conventional matching circuit.
Figure 1B:
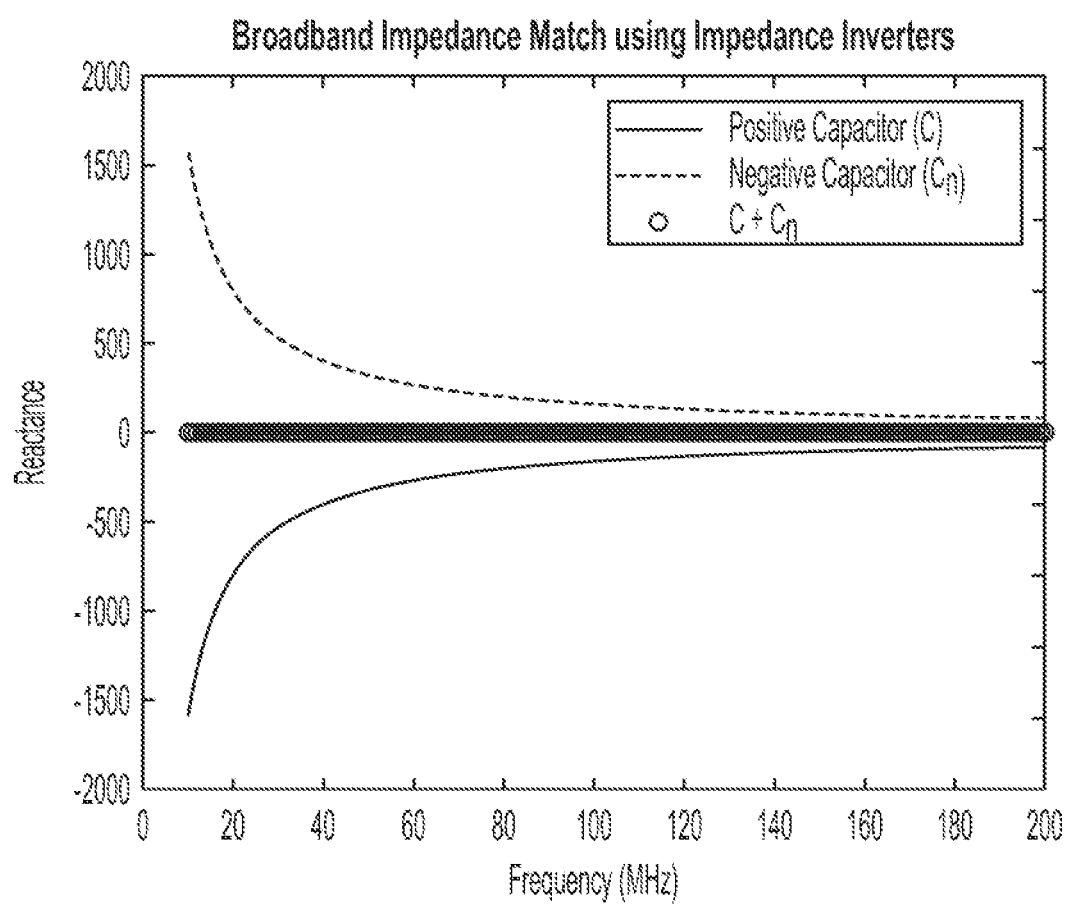
FIG. 1B is a graph showing performance of a negative impedance matching circuit.
Figure 2:
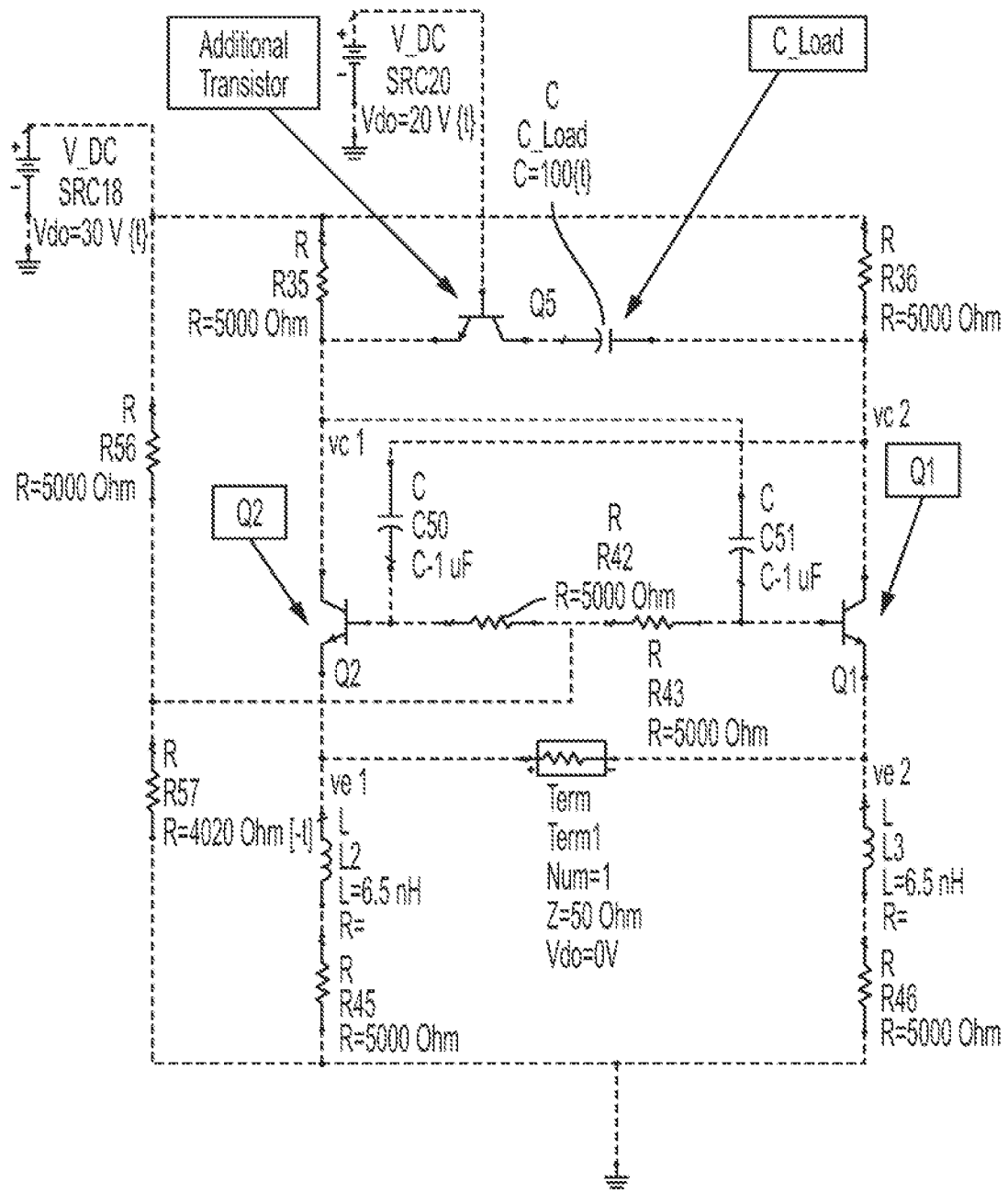
FIG. 2 is a schematic representation of a tunable negative impedance inverter circuit.

Referring now to the figures, wherein like reference numerals refer to like parts throughout, FIG. 2 is a schematic representation of a tunable negative impedance inverter circuit. An important factor to consider when designing negative impedance circuits is stability. Specifically, FIG. 2 shows a modified version of Linville's circuit. As known by those having ordinary skill in the art, Linville introduced a transistor-based negative impedance converter (hereinafter "NIC") in 1952 and discussed the details of implementing such a circuit with transistors. Such details include the stability conditions associated with different topologies of the circuits and practical aspects of the circuit, for example, proper operating points, distortion, and quiescent current dissipation. Linville's circuit was simulated using Advanced Design System (ADS) and shown to indeed exhibit a negative impedance plotted over frequency. Harris and Myers introduced a variation of Linville's circuit that added additional transistor stages to improve the stability of the active circuit. The third transistor modification described earlier was also simulated with the improved stability circuit and likewise shown to provide tunability.

Still referring to FIG. 2, the tunable negative impedance inverter circuit has transistors Q1 and Q2 (i.e., first and second transistors) that serve to create the negative impedance. Q1 and Q2 are in the common collector transistor configuration. As current travels through capacitor C_Load, the pair of common collector transistors sample the voltage at each end of this load capacitor and invert the voltage at the input of the circuit. This results in the input appearing to have the negative of the load impedance. It is important to note that the current across C_Load has not changed while the voltage has the opposite sign. The result is an input impedance of the circuit that follows somewhat closely that of the negative of the C_Load capacitance in this configuration.

Past attempts at creating tunability of the transistor-based NIC include replacing the fixed capacitor with a variable capacitor (i.e., varactor). The present disclosure achieves a tunable circuit while avoiding altering the C_Load. To do so, an additional transistor (i.e., third transistor) is added in series with the load capacitance to achieve "on-the-fly" tunability. In an embodiment, the additional transistor is the same type of transistor as the Q1 and Q2 transistors. Therefore, no additional component types are required to tune the circuit. The addition of this transistor is shown in FIG. 2. This allows the voltages sampled by the two common collector amplifiers (Q1 and Q2) to be changed by changing the base voltage of the added transistor. The current through the load capacitance, however, is only slightly increased by a tiny amount of base current due to the nature of the bipolar junction transistor (BJT) transistor. Therefore, when the resulting voltage over current relationship is observed, the negative impedance becomes tunable by changing the base voltage of the added transistor.

Figure 3:
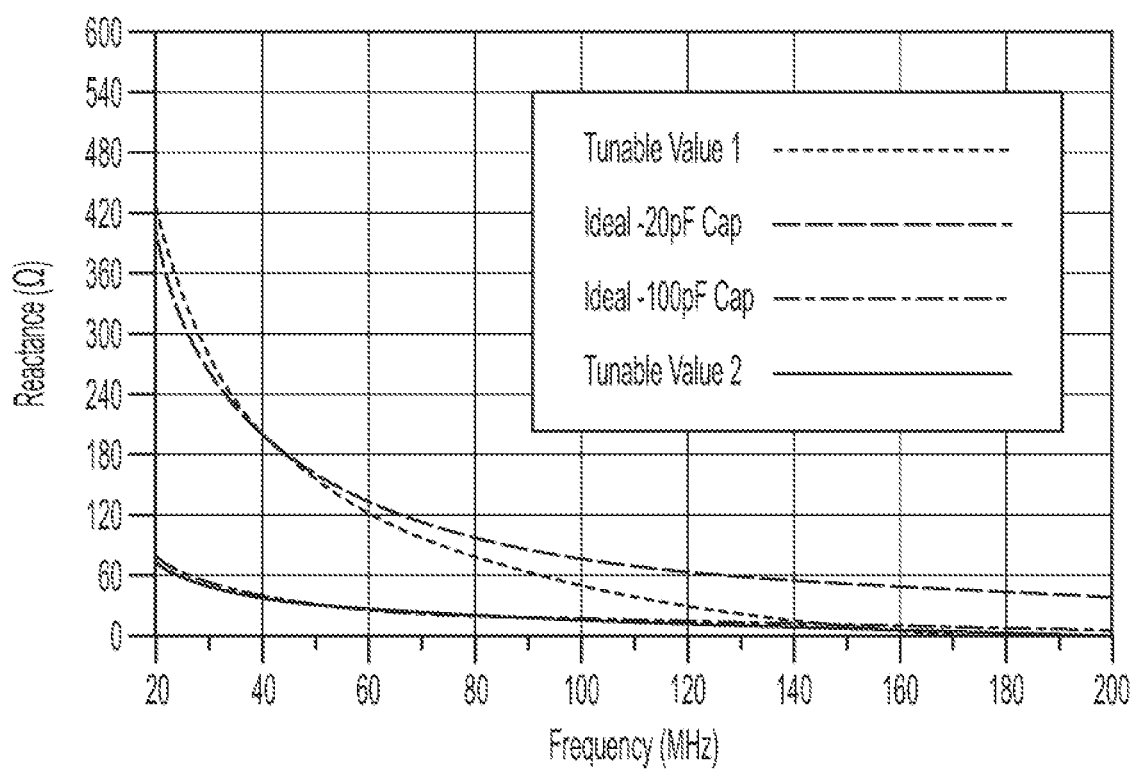
FIG. 3 is a graph showing the reactance of a tunable circuit tuned for −20 pF to −100 pF.

Turning now to FIG. 3, there is shown a graph showing the reactance of a tunable circuit tuned for −20 pF and for −100 pF. The ADS model for this circuit shows that at the maximum tuning voltage, the capacitance is observed to be −100 pF and at the minimum tuning voltage, the impedance is observed at −20 pF. Accordingly, FIG. 3 shows the tuning range of the proposed circuit compared to the ideal impedance elements.

As stated above, non-Foster circuits are one way to increase impedance bandwidth and adding a transistor, as described above, makes the circuit tunable. This allows the tunable circuit to be suitable for antennas. For example, a resistively loaded dipole can be used for direction finding applications. A resistively loaded dipole was designed, simulated, and built to cover 20 MHz to 6 GHz. Due to the large bandwidth, a special modification to a dipole antenna is necessary. For a normal conducting dipole antenna that services such a wide frequency range, antiresonances cause deep nulls in the realized gain at certain frequencies and resonances, in general, distort the gain patterns at many frequencies. To mitigate this, resistive loading is utilized to suppress the current standing waves across the antenna surface. This makes the antenna "better behaved" and produce a more consistent radiation pattern.

The non-Foster network can improve the sensitivity of the resistively loaded dipole antenna. Although the resistive loading tends to maintain a reasonably omnidirectional pattern across a wide band, the impedance can vary somewhat across the band especially at the low end. The tunability described above and built into this non-Foster network provides the improved impedance match across the band. Continuous tunability across the frequency band achieves the best results. Since the tuning parameters are easily adjusted, prior measurements can be taken to determine the optimum settings for each frequency in the band, and retuning can be easily performed as needed. This feature is of particular benefit in direction finding applications. Furthermore, the flexibility of the tunable circuit facilitates use with different antennas and deployment in varied environments.

The varactor method of tuning described earlier would not be ideal for direction finding applications. The varactor results in an inverted capacitance curve and thus is limited to antennas that have an impedance curve that closely resembles that of an ideal capacitance. The reactance curve of the resistive dipole does loosely resemble that of a capacitor, but can deviate from that across much of the band, especially at higher frequencies. The third transistor method described herein allows for easy adjustment to match antennas with arbitrary impedance curves, not just those resembling a capacitor.

While various embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, embodiments may be practiced otherwise than as specifically described and claimed. Embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

Figure 4:
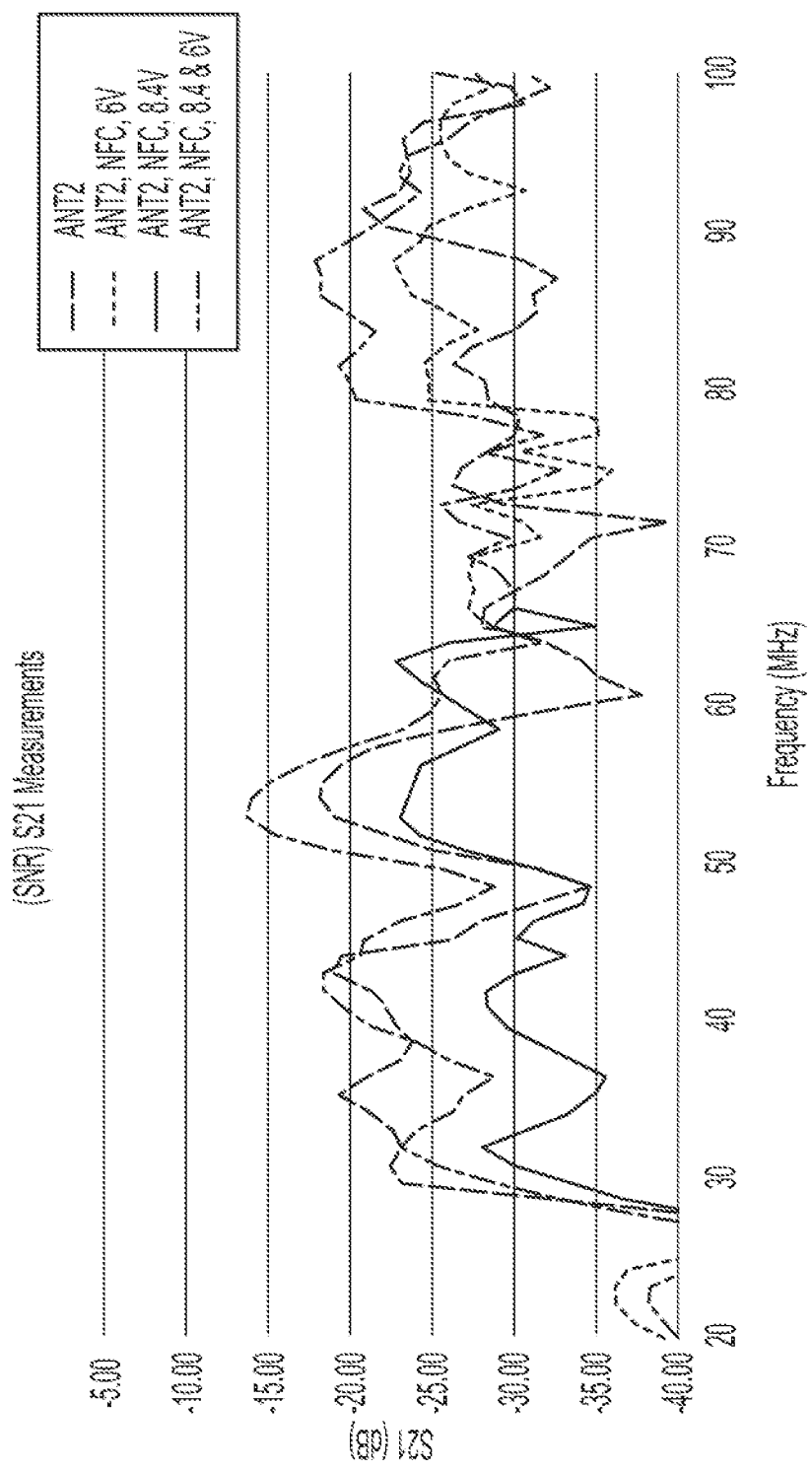
FIG. 4 is a graph showing performance of an antenna having a tunable non-Foster circuit according to aspects of the present invention.

FIG. 4 is a graph showing performance of an antenna having a tunable non-Foster circuit to provide a variable resistive load according to aspects of the present invention. The graph illustrates data for a variable-load circuit switchable between 6V and 8.4V to achieve a variable load. The tuning voltage is set at 6V for a frequency range of 30-65 MHz, and 8.4V for a frequency range of 65-100 MHz. The graph also illustrates data for a fixed voltage of 6V, data for a fixed voltage of 8.4V for comparison, and data for an antenna having no load. As is apparent from the graph, the result of the variable load is a significant improvement in wideband performance of the antenna signal-to-noise ratio. In particular, the variable circuit provides a generally higher signal-to-noise output across the bandwidth. While the illustrated example includes only two ranges having different loads, it is to be appreciated that a band of ranges can be divided into two or more ranges.

The above-described embodiments of the described subject matter can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single device or computer or distributed among multiple devices/computers.

What is claimed is:

1. A system for tuning a transistor-based circuit, comprising:
   a negative impedance converter circuit having a capacitor characterizable by a current traveling therethrough, a first transistor, and a second transistor
   wherein the first transistor and the second transistor together sample voltage across a capacitor and invert the voltage present at an input of the negative impedance converter circuit;
   a third transistor in series with the capacitor, the third transistor having a base voltage; and
   wherein changing the base voltage of the third transistor changes the voltage sampled by the first transistor and the second transistor.

2. The system of claim 1, wherein the first transistor samples voltage at a first end of the capacitor and the second transistor samples voltage at an opposing second end of the capacitor.

3. The system of claim 1, wherein the first and second transistors are in a common collector configuration.

4. The system of claim 1, wherein the voltage has an opposite sign relative to the current.

5. The system of claim 1, wherein the capacitance of the third transistor is tunable over a predetermined range.

6. The system of claim 5, wherein the predetermined range includes −20 pF to −100 pF.

7. A method for tuning a transistor-based circuit, comprising the steps of:
   providing a negative impedance converter circuit having a capacitor, a first transistor, and a second transistor, and a third transistor in series with the capacitor;
   passing a current through capacitor;
   sampling, via the first transistor and the second transistor, a voltage at the capacitor;
   inverting, via the first transistor and the second transistor, the voltage at an input of the negative impedance converter circuit; and
   changing a base voltage of the third transistor, which changes the voltage sampled by the first transistor and the second transistor.

8. The method of claim 7, wherein the first transistor samples voltage at a first end of the capacitor and the second transistor samples voltage at an opposing second end of the capacitor.

9. The method of claim 7, wherein the first and second transistors are in a common collector configuration.

10. The method of claim 7, wherein the voltage has an opposite sign relative to the current.

11. The method of claim 7, wherein the capacitance of the third transistor is tunable over a predetermined range.

12. The method of claim 11, wherein the predetermined range includes −20 pF to −100 pF.

13. A system for tuning a transistor-based circuit for a low-frequency antenna, comprising:
   a resistively loaded dipole antenna having a negative impedance converter circuit with a capacitor, a first transistor, and a second transistor;
   a current traveling through the capacitor;
   wherein the first transistor and the second transistor each sample voltage at the capacitor and invert the voltage at an input of the negative impedance converter circuit;
   a third transistor in series with the capacitor, the third transistor having a base voltage; and wherein changing the base voltage of the third transistor changes the voltage sampled by the first transistor and the second transistor.

14. The system of claim 13, wherein the resistively loaded dipole antenna has a predetermined multioctave bandwidth.

15. The system of claim 14, wherein the predetermined multioctave bandwidth is in the range of 20 MHz to 6 GHz.

16. The system of claim 13, wherein the first transistor samples voltage at a first end of the capacitor and the second transistor samples voltage at an opposing second end of the capacitor.

17. The system of claim 13, wherein the first and second transistors are in a common collector configuration.

18. The system of claim 13, wherein the voltage has an opposite sign relative to the current.

19. The system of claim 13, wherein the capacitance of the third transistor is tunable over a predetermined range.

20. The system of claim 19, wherein the predetermined range includes −20 pF to −100 pF.

* * * * *